(12) United States Patent
Park

(10) Patent No.: US 9,813,018 B2
(45) Date of Patent: Nov. 7, 2017

(54) SOLAR CELL APPARATUS

(75) Inventor: Chi Hong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 969 days.

(21) Appl. No.: 13/321,757

(22) PCT Filed: Sep. 30, 2010

(86) PCT No.: PCT/KR2010/006711
§ 371 (c)(1),
(2), (4) Date: Nov. 21, 2011

(87) PCT Pub. No.: WO2011/040784
PCT Pub. Date: Apr. 7, 2011

(65) Prior Publication Data
US 2012/0174958 A1   Jul. 12, 2012

(30) Foreign Application Priority Data

Sep. 30, 2009   (KR) .................. 10-2009-0093623

(51) Int. Cl.
| H01L 31/042 | (2014.01) |
| H02S 40/34 | (2014.01) |
| H01L 31/02 | (2006.01) |
| H01L 31/048 | (2014.01) |
| H01L 31/044 | (2014.01) |
| H02S 30/10 | (2014.01) |

(52) U.S. Cl.
CPC .......... *H02S 40/34* (2014.12); *H01L 31/0201* (2013.01); *H01L 31/044* (2014.12); *H01L 31/048* (2013.01); *H02S 30/10* (2014.12); *Y02E 10/50* (2013.01)

(58) Field of Classification Search
CPC . H01L 31/0201; H01L 31/048; H01L 31/044; H02S 40/34; Y02E 10/50
USPC .......................................... 136/244
See application file for complete search history.

(56) References Cited

U.S. PATENT DOCUMENTS

| 4,392,009 A * | 7/1983 | Napoli .................. 136/251 |
| 4,830,038 A * | 5/1989 | Anderson et al. ........... 136/251 |
| 5,128,181 A | 7/1992 | Kunert |
| 6,553,729 B1 * | 4/2003 | Nath .............. H01L 31/048 |
| | | 136/245 |

(Continued)

FOREIGN PATENT DOCUMENTS

| CN | 10-1245686 A | 8/2008 |
| DE | 3801989 A1 | 7/1989 |

(Continued)

OTHER PUBLICATIONS

International Search Report in International Application No. PCT/KR2010/006711, filed Sep. 30, 2010.

(Continued)

*Primary Examiner* — Tamir Ayad
(74) *Attorney, Agent, or Firm* — Saliwanchik, Lloyd & Eisenschenk

(57) ABSTRACT

Disclosed is a solar cell apparatus. The solar cell apparatus includes a first substrate including a first region and a second region adjacent to the first region, a plurality of solar cells in the first region, and a second substrate provided in the first region to expose the second region and provided on the solar cells.

7 Claims, 4 Drawing Sheets

(56) References Cited

U.S. PATENT DOCUMENTS

| | | | |
|---|---|---|---|
| 8,030,569 B2 * | 10/2011 | Nakata | 136/250 |
| 2005/0000562 A1 | 1/2005 | Kataoka et al. | |
| 2006/0219291 A1 | 10/2006 | Hikosaka et al. | |
| 2008/0289679 A1 * | 11/2008 | Ressler | E04D 1/08 136/244 |
| 2009/0139165 A1 | 6/2009 | Prete et al. | |
| 2010/0059102 A1 | 3/2010 | Yagiura et al. | |

FOREIGN PATENT DOCUMENTS

| | | |
|---|---|---|
| FR | 2362494 A1 | 3/1978 |
| JP | H03-21743 A | 1/1991 |
| JP | 11-303325 | 11/1999 |
| JP | H11-330524 A | 11/1999 |
| JP | 2000-356417 A | 12/2000 |
| JP | 2001-015788 A | 1/2001 |
| JP | 2001-098856 A | 4/2001 |
| JP | 2001-339087 A | 12/2001 |
| JP | 2001-339088 A | 12/2001 |
| JP | 2002-094088 A | 3/2002 |
| JP | 2003-158285 A | 5/2003 |
| JP | 2006-019532 A | 1/2006 |
| JP | 2006-165172 A | 6/2006 |
| JP | 2007-095819 A | 4/2007 |
| JP | 2008-160049 A | 7/2008 |
| JP | 2008-258269 A | 10/2008 |
| JP | 2008-288547 A | 11/2008 |
| KR | 10-2006-0105535 A | 10/2006 |
| WO | WO2007/080631 * 7/2007 ........... H01L 31/042 |  |
| WO | WO-2008-148524 A1 | 12/2008 |

OTHER PUBLICATIONS

Office Action dated Apr. 1, 2014 in Japanese Application No. 2012-532020.

European Search Report dated May 21, 2014, in European Application No. 10820857.

Office Action dated Aug. 25, 2014 in Japanese Application No. 2012-532020.

Office Action dated Jan. 24, 2014 in Chinese Application No. 2010-800438923.

Office Action dated Oct. 28, 2015 in European Application No. 10820857.0.

* cited by examiner

[Figure 1]
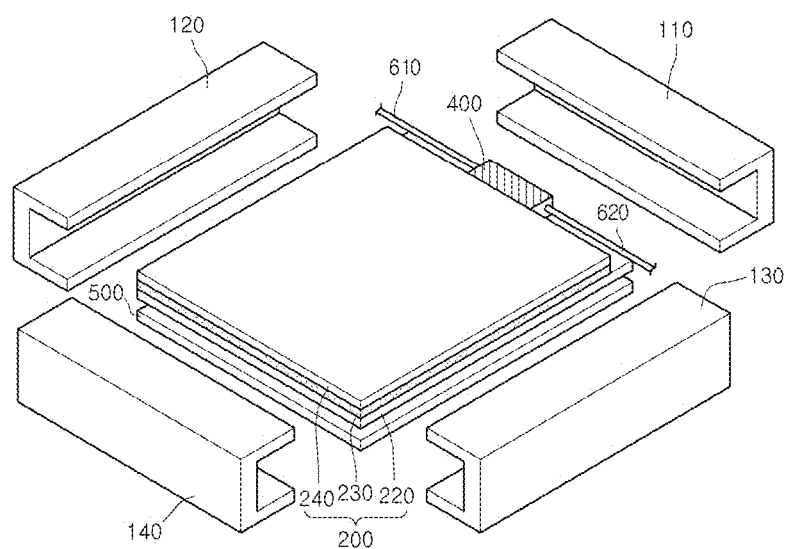
[Figure 2]
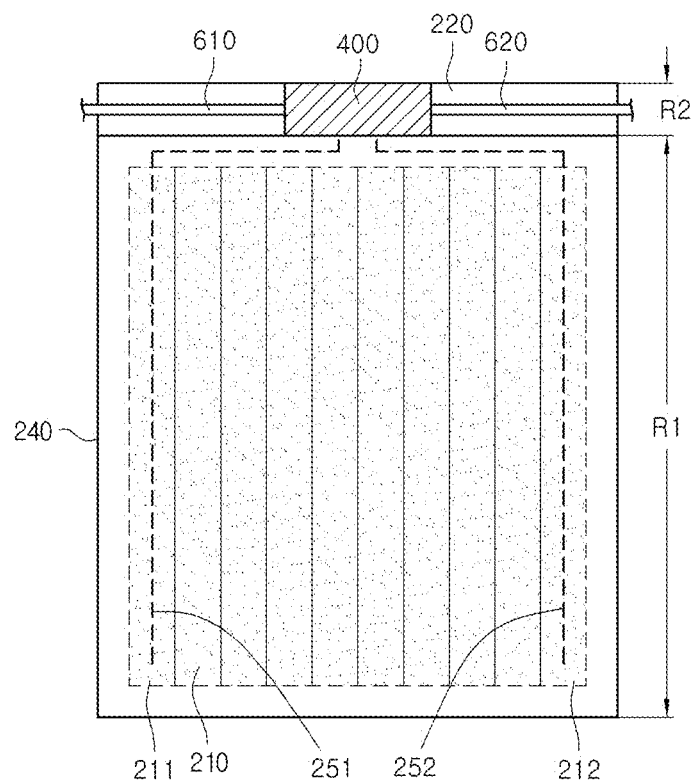

[Figure 3]
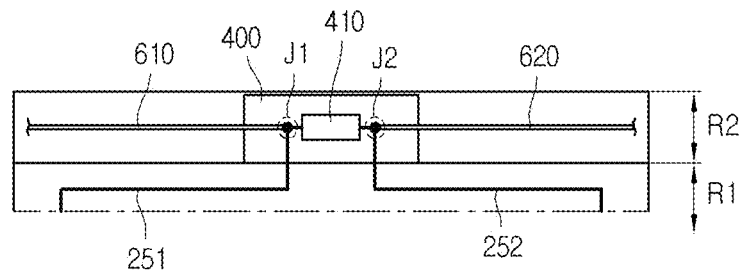
[Figure 4]
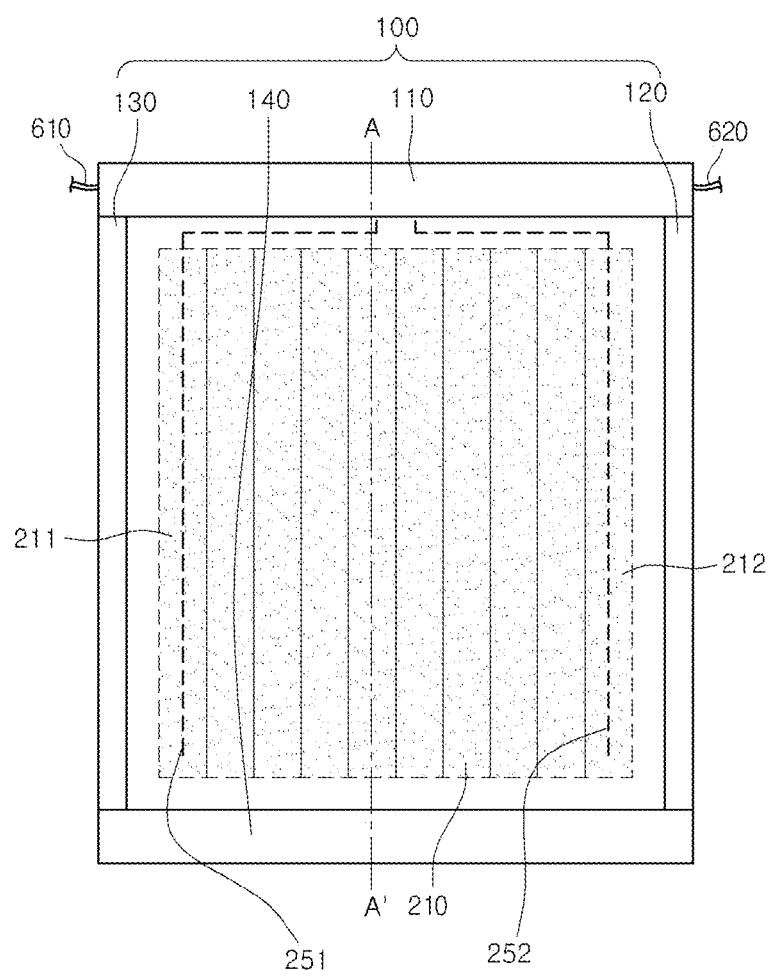

[Figure 5]
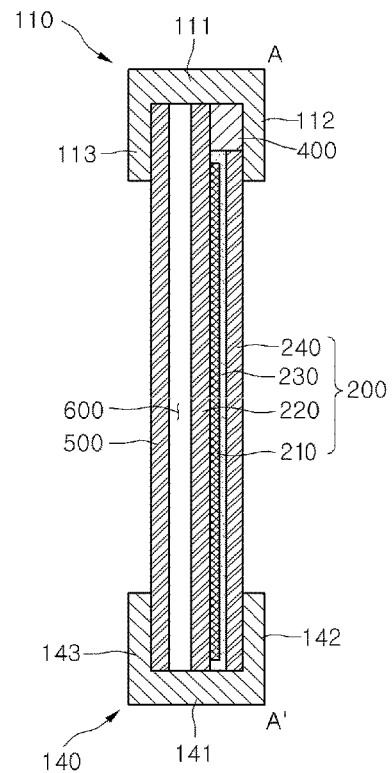
[Figure 6]
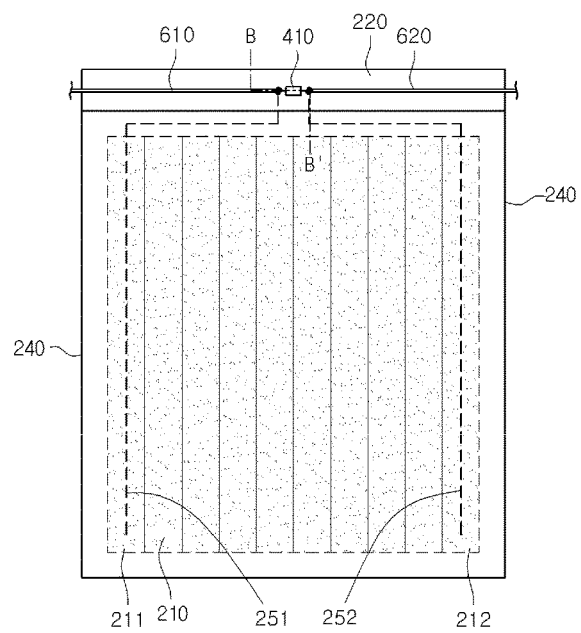

[Figure 7]
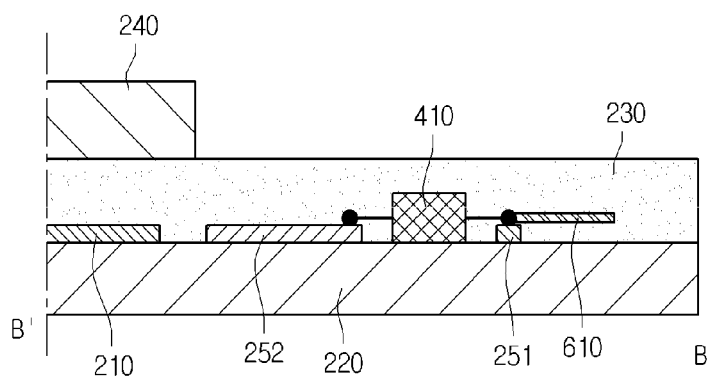

SOLAR CELL APPARATUS

CROSS-REFERENCE TO RELATED APPLICATIONS

This application is the U.S. national stage application of International Patent Application No. PCT/KR2010/006711, filed Sep. 30, 2010, which claims priority to Korean Application No. 10-2009-0093623, filed Sep. 30, 2009, the disclosures of each of which are incorporated herein by reference in their entirety.

BACKGROUND

The embodiment relates to a solar cell apparatus.

A solar cell module for converting photo energy into electric energy through the photoelectric transformation has been extensively used to obtain clean energy contributing to environmental conservation of the earth.

As the photoelectric transformation efficiency of a solar cell has been improved, a solar cell system including the solar cell module is used for the residential purpose.

In order to output power generated from the solar cell module including solar cells that generate power from solar light, conductors having the function of positive and negative electrodes are provided in the solar cell module, and terminals of the conductors, which serve as connectors connected to a cable to output current to the outside, are provided out of a photovoltaic module.

SUMMARY

The embodiment provides a solar cell apparatus having an improved strength and an improved outer appearance.

According to the embodiment, a solar cell apparatus includes a first substrate including a first region and a second region adjacent to the first region, a plurality of solar cells in the first region, and a second substrate provided in the first region to expose the second region and provided on the solar cells.

According to the embodiment, a solar cell apparatus includes a solar cell panel, a protective substrate provided on the solar cell panel, and a junction box provided on a top surface of the solar cell panel and provided at the lateral surface of the protective substrate.

According to the embodiment, a solar cell apparatus includes a substrate, first and second solar cells provided on the substrate, a first bus bar provided on the substrate and connected to the first solar cell, a second bus bar provided on the substrate and connected to the second solar cell, a first connection wire connected to the first bus bar and provided on the top surface of the substrate, and a second connection wire connected to the second bus bar and provided on the top surface of the substrate.

As described above, according to the solar cell apparatus of the embodiment, the junction box is provided on the top surface of the solar cell panel. In other words, in the solar cell apparatus according to the embodiment, the junction box is attached to the top surface of the first substrate, and the bus bars, the connection wires, and the diode can be arranged on the top surface of the first substrate.

In addition, the junction box can be attached to the outer peripheral portion of the top surface of the first substrate. Accordingly, the junction box can be received in the frame. Therefore, in the solar cell apparatus according to the embodiment, the junction box can be securely attached to the solar cell panel.

Further, in the solar cell apparatus according to the embodiment, since the bus bars, the connection wires, and the diode are provided on the top surface of the first substrate, a through hole may not be formed in the first substrate.

In other words, when the connection wires, the diode, and the junction box is provided on the bottom surface of the first substrate, through holes must be formed to allow the bus bars to extend to the bottom surface of the first substrate.

However, since the through hole may be not formed in the first substrate, the solar cell apparatus according to the embodiment can be easily formed and has improved strength.

BRIEF DESCRIPTION OF THE DRAWINGS

FIG. 1 is an exploded perspective view showing a solar cell module according to the embodiment;

FIG. 2 is a plan view showing a solar cell panel;

FIG. 3 is a view showing bus bars, a diode, and wires;

FIG. 4 is a plan view showing a solar cell module according to the embodiment;

FIG. 5 is a sectional view taken along line A-A' of FIG. 4;

FIG. 6 is a plan view showing a solar cell module according to another embodiment; and FIG. 7 is a sectional view taken along line B-B' of FIG. 6.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

FIG. 1 is an exploded perspective view showing a solar cell module according to the embodiment, FIG. 2 is a plan view showing a solar cell panel, and FIG. 3 is a view showing bus bars, a diode, and connection wires. FIG. 4 is a plan view showing a solar cell module according to the embodiment, and FIG. 5 is a sectional view taken along line A-A' of FIG. 4.

Referring to FIGS. 1 to 5, the solar cell module according to the embodiment includes a frame 100, a solar cell panel 200, a junction box 400, a first connection wire 610, a second connection wire 620, and a third substrate 500.

The frame 100 receives the solar cell panel 200, the junction box 400, and the third substrate 500. In detail, the frame 100 receives a lateral surface of the solar cell panel 200. In addition, the frame 100 surrounds the lateral surfaces of the solar cell panel 200.

The frame 100 receives an outer peripheral portion of the solar cell panel 200, an outer peripheral portion of the third substrate 500, and the junction box 400. The frame 100 can receive the whole junction box 400.

For example, the flame 100 may be provided around four lateral surfaces of the solar cell panel 200. The frame 100 may include metal such as aluminum (Al). The frame 100 includes first to fourth sub-frames 110, 120, 130, and 140.

The first sub-frame 110 surrounds one lateral surface of the solar cell panel 200. The first sub-frame 110 receives the junction box 400. The first sub-frame 110 may receive the whole junction box 400.

The first sub-frame 110 includes first to third support parts 111 to 113. The first support part 111 is provided at the lateral surface of the solar cell panel 200 to support the lateral surface of the solar cell panel 200.

The second support part 112 extends from the first support part 111. The second support part 112 extends from the first support part 111 while being bent or curved from an end portion of the first support part 111. The second support part 112 extends inward from the first support part 111. In addition, the second support part 112 is provided on a top surface of the solar cell panel 200 to support the top surface of the solar cell panel 200.

The third support part 113 extends inwardly from the first support part 111. The third support part 113 extends from the first support part 111 while being bent or curved from an end portion of the first support part 111. The third support part 113 supports a lower portion of the third substrate 500. The first to third support parts 111 to 113 are integrally formed with each other.

The fourth sub-frame 140 surrounds another lateral surface of the solar cell panel 200. The fourth sub-frame 140 includes fourth to sixth support parts 141 to 143. The fourth sub-frame 140 is provided at the lateral surface of the solar cell panel 200 to support the lateral surface of the solar cell panel 200.

The fifth support part 142 extends from the fourth support part 141. The fifth support part 142 extends from the fourth support part 141 while being bent or curved from an end portion of the fourth support part 141. The fifth support part 142 extends inward from the fourth support part 141. In addition, the fifth support part 142 is provided on a top surface of the solar cell panel 200 to support the top surface of the solar cell panel 200.

The sixth support part 143 extends inwardly from the fourth support part 141. The sixth support parts 143 extends from the fourth support part 141 while being bent or curved from an end portion of the fourth support part 141. The sixth support part 143 supports a lower portion of the third substrate 500. The fourth to sixth support parts 141 to 143 are integrally formed with each other.

The second and third sub-frames 120 and 130 surround other lateral surfaces of the solar cell panel 200 while being coupled with both end portions of the first sub-frame 110. Support parts of the second and third sub-frames 120 and 130 have the same structures as that of the fourth sub-frame 140. Accordingly, the details of the second and third sub-frames 120 and 130 will be omitted.

The solar cell panel 200 is provided inside the frame 100. In detail, the solar cell plane 200 is received in the frame 100. In more detail, outer peripheral portions of the solar cell panel 200 are inserted into the frame 100.

The solar cell panel 200 has a plate shape. In detail, the solar cell panel 200 may have the shape of a rectangular plate. The solar cell panel 200 has a plate shape with a step difference. The solar cell panel 200 includes a first substrate 220, a plurality of solar cells 210, a first bus bar 251, a second bus bar 252, a buffer film 230, and a second substrate 240.

The first substrate 220 may include an insulator. The first substrate 220 may include a glass substrate, a plastic substrate, or a metallic substrate. In detail, the first substrate 220 may include a soda lime glass. The first substrate 220 may be transparent. The first substrate 220 may be rigid.

The first substrate 220 includes a first region R1 and a second region R2. In detail, the first and second regions R1 and R2 are defined in the first substrate 220. In other words, the first substrate 220 is divided by the first and second regions R1 and R2.

The first region R1 is adjacent to the second region R2. The first region R1 occupies most of the area of the first substrate 220. The second region R2 is provided at an outer peripheral portion of the first substrate 220.

The solar cells 210 are provided on the first substrate 220. In detail, the solar cells 210 are provided on the first region R1. The solar cells 210 directly make contact with a top surface of the first substrate 210 corresponding to the first region R1.

The solar cells 210 convert the light of the sun into electrical energy. The solar cells 210 may be connected to each other in series. The solar cells 210 may include solar cells including group I-III-IV semiconductor compounds, such as CIGS-based solar cells, silicon-based solar cells, or dye-sensitized solar cells.

The solar cells 210 may be arranged in the form of a stripe. The solar cells 210 may be connected to each other in series.

The first bus bar 251 is connected to the solar cells 210. In detail, the first bus bar 251 is connected to one of the solar cells 210. In more detail, the first bus bar 251 is provided on a top surface of one of the solar cells 210 located the outermost region of the first substrate 220.

The first bus bar 251 includes a conductor. The first bus bar 251 includes copper (Cu) or silver (Ag). The first bus bar 251 makes contact with the top surface of one of the solar cells 210 located in the outermost region.

The first bus bar 251 is provided on the first substrate 220. The first bus bar 251 may extend from the first region R1 to the second region R2. In detail, the first bus bar 251 extends from the top surface of one of outermost solar cells 211 and 212 to the junction box 400.

The first bus bar 251 is electrically connected to the first connection wire 610. Current generated from the solar cells 210 may be transferred to a charging device through the first bus bar 251 and the first connection wire 610.

The second bus bar 252 is connected to the solar cells 210. In detail, the second bus bar 252 is connected to one of the solar cells 210. In more detail, the second bus bar 252 is connected to the other of the outermost solar cells 211 and 212.

The second bus bar 252 includes a conductor. The second bus bar 252 may include Cu or Ag. The second bus bar 252 makes contact with the top surface of the other of the solar cells 210 located in the outermost region.

The second bus bar 252 is provided on the first substrate 220. The second bus bar 252 may extend from the first region R1 to the second region R2. In detail, the second bus bar 252 extends the top surface of the other of the outermost solar cells 211 and 212 to the junction box 400.

The second bus bar 252 is electrically connected to the second connection wire 620. Current generated from the solar cells 210 may be transferred to a charging device through the first bus bar 252 and the second connection wire 620.

The buffer film 230 is provided on the solar cells 210. The buffer film 230 covers the solar cells 210. In detail, the buffer film 230 covers the first and second bus bars 251 and 252.

The buffer film 230 may be provided only on the first region R1. In other words, the buffer film 230 may expose the second region R2 without covering the second region R2. The buffer film 230 may cover portions of the first and second bus bars 251 and 252, and expose the other portions of the first and second bus bars 251 and 252.

The buffer film 230 absorbs the physical shock applied to the solar cells 210. In addition, the buffer film 230 prevents oxygen and/moisture from being infiltrated into the solar cells 210.

The buffer film 230 has elasticity and is transparent. The buffer film 230 may include ethylene vinyl acetate (EVA).

The second substrate 240 is provided on the first substrate 220. The second substrate 240 is provided on the buffer film 230 while covering the solar cells 210. The second substrate 240 is provided in the first region R1. The second substrate 240 exposes the second region R1 without being provided in the second region R1.

The second substrate 240 has a step difference from the first substrate 220. Since the second substrate 240 is provided in the first region R1 without being provided in the second region R2, the step difference is made in the second region R2. The surface area of the second substrate 240 may be smaller than that of the first substrate 220.

The second substrate 240 is transparent and has high rigid. The second substrate 240 includes a glass substrate. For example, the second substrate 240 may include tempered glass. The second substrate 240 protects the solar cells 210 from external shock.

The second substrate 240 may closely make contact with the top surface of the buffer film 230. The buffer film 230 may closely make contact with the top surface of the first substrate 220. The buffer film 230 may closely make contact with the top surface of the solar cells 210.

The junction box 400 is provided in the second region R2. The junction box 400 is provided on the top surface of the first substrate 220. The junction box 400 is provided at the lateral surface of the second substrate 240. In other words, the junction box 400 is attached to the top surface of the first substrate 220 while making contact with the lateral surface of the second substrate 240.

As shown in FIGS. 4 and 5, the junction box 400 is provided inside the frame 100.

The first and second substrates 220 and 240 have a step difference therebetween. The junction box 400 is provided in a region formed with the step difference. Accordingly, the junction box 400 can be more securely attached to the first and second substrate 220 and 240.

In addition, since the junction box 400 is provided inside the frame 100, the junction box 400 can be prevented from being moved or getting out of the frame 100. In other words, the junction box 400 can be effectively protected by the frame 100.

The junction box 400 can receive a portion of the first bus bar 251, a portion of the second bus bar 252, a portion of the first connection wire 610, a portion of the second connection wire 620, and a diode 410.

In other words, the junction box 400 covers a connection part J1 of the first bus bar 251 and the first connection wire 610 and a connection part J2 of the second bus bar 252 and the second connection wire 620.

The diode 410 is electrically connected to the first and second bus bars 251 and 252. In addition, the diode 410 is electrically connected to the first and second connection wires 610 and 620. The diode 410 connects adjacent solar cells modules to each other when the solar cell module according to the embodiment is in the impossible state.

The junction box 400 covers the diode 410. The junction box 400 is provided therein with a circuit board used to connect the first bus bar 251, the second bus bar 252, the diode 410, the first connection wire 610, and the second connection wire 620 to each other.

In other words, the junction box 400 serves as a housing to receive a portion of the bus bar 251, a portion of the second bus bar 252, the diode 410, and the circuit board.

The first connection wire 610 extends from the inside of the junction box 400 to the outside. In detail, the first connection wire 610 may extend from the inside of the junction box 400 to the outside of the frame 100 along the inside of the frame 100.

The first connection wire 610 is connected to the first bus bar 251. The first connection wire 610 may be connected to an adjacent solar cell module or the charging device.

The second connection wire 620 extends from the inside of the junction box 400 to the outside thereof. In detail, the first connection wire 610 may extend from the inside of the junction box 400 to the outside of the frame 100 along the inside of the frame 100.

The second connection wire 620 is connected to the second bus bar 252. The second connection wire 620 may be connected to an adjacent solar cell module or the charging device.

The third substrate 500 is provided below the first substrate 220. The third substrate 500 is spaced apart from the first substrate 220 by a predetermined distance, thereby forming an air gap 600. The outer peripheral portion of the third substrate 500 is inserted into the frame 100.

The air gap 600 serves as an insulator between the inside and outside of a building when the solar cell module according to the embodiment is applied to the building. In this case, the air gap 600 may be formed by filling nitrogen gas ($N_2$) and argon gas (Ar) between the first and third substrates 220 and 500. The thickness of the air gap 600 may be adjusted by modifying the design of the frame 100.

In addition, since the junction box 400 is attached to the top surface of the first substrate 200, the third substrate 500 can be easily attached to the bottom surface of the first substrate 220.

In the solar cell module according to the embodiment, the junction box 400 is attached to the top surface of the first substrate 220, and provided in the frame 100. Accordingly, the junction box 400 is securely attached to the first substrate 220.

In addition, the first and second bus bars 251 and 252, the diode 410, and the first and second connection wires 610 and 620 are provided on the top surface of the first substrate 220. Accordingly, holes used to extend the first and second bus bars 251 and 252 to the bottom surface of the first substrate 220 are not required in the first substrate 220.

Therefore, the solar cell module according to the embodiment can be easily manufactured with improved mechanical strength.

The junction box 400 may be coupled with the inside of the frame 100 after attaching the junction box 400 to the top surface of the first substrate 220. Therefore, the junction box 400 can be prevented from being moved or getting out of the frame 100.

In addition, the solar cell module according to the present embodiment is a kind of a solar cell apparatus to convert external light to electrical energy. The structure of the solar cell module according to the present embodiment is applicable to various solar cell apparatuses.

FIG. 6 is a solar cell module according to another embodiment. FIG. 7 is a sectional view taken along line B-B' of FIG. 6. The present embodiment will be described by making reference to the description about the solar cell module according to the previous embodiment, and the buffer film 230 will be additionally described. The description about the previous embodiment will be incorporated with the description about the present embodiment except for the modifications of the previous embodiment.

Referring to FIGS. 6 and 7, the solar cell module according to the present embodiment may not include a junction box.

The buffer film 230 may be provided in the second region R2. In other words, the buffer film 230 may cover the second region R2. The buffer film 230 may cover the whole parts of the first and second bus bars 251 and 252. In addition, the buffer film 230 may cover the diode 410. In addition, the buffer film 230 may cover the first and second connection wires 610 and 620.

Therefore, the buffer film 230 may act as a junction box. In other words, the buffer film 230 can protect the diode 410.

The second substrate 240 exposes a portion of the top surface of the buffer film 230. In other words, the second substrate 240 may be stacked on the buffer film 230 while making a step difference.

The solar cell panel 200 according to the embodiment may be easily manufactured without the use of the junction box.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The solar cell module according to the embodiment is applicable to the field of solar power generation.

What is claimed is:

1. A solar cell apparatus comprising:
    a solar cell panel;
    a junction box on the solar cell panel;
    a third substrate provided below the solar cell panel; and
    a frame surrounding the solar cell panel and the third substrate,
    wherein the solar cell panel comprises:
        a first substrate including a first region and a second region adjacent to the first region;
        a plurality of solar cells in the first region; and
        a second substrate disposed in the first region to expose the second region and disposed on the solar cells,
    wherein the junction box is disposed in the second region and disposed on a lateral surface of the second substrate;
    wherein the frame surrounds a lateral side of the solar cell panel, a lateral side of the third substrate, and a lateral side of the junction box,
    wherein the junction box is surrounded by the first substrate, the second substrate, and the frame,
    wherein the junction box is in direct contact with a top surface of the second region of the first substract,
    wherein the junction box is in direct contact with an inner surface of the frame,
    wherein the junction box is in direct contact with the lateral surface of the second substrate,
    wherein the solar cells and the junction box are disposed on a same surface of the first substrate,
    wherein the solar cells and the junction box are in direct contact with the same surface of the first substrate,
    wherein inert gas is filled in space between the first substrate and the third substrate,
    wherein the first substrate includes a soda lime glass,
    wherein the second substrate includes a tempered glass,
    wherein the first substrate and the second substrate are transparent,
    wherein an area of a top surface of the second substrate is smaller an area of a top surface of the first substrate, and
    wherein the plurality of solar cells is spaced apart from the inert gas.

2. The solar cell apparatus of claim 1, further comprising a bus bar connected to the solar cells and extending from the first region to the second region.

3. The solar cell apparatus of claim 2, further comprising a connection wire provided in the second region and connected to the bus bar.

4. The solar cell apparatus of claim 1, further comprising a first bus bar connected to one of the solar cells and extending from the first region to the second region;
    a second bus bar connected to another solar cell of the solar cells and extending from the first region to the second region; and
    a diode connected to the first and second bus bars and provided in the second region.

5. The solar cell apparatus of claim 1, further comprising a buffer film interposed between the first and second substrates and provided in the first region while exposing the second region.

6. The solar cell apparatus of claim 1, wherein the first substrate is formed with a step difference with respect to the second substrate.

7. The solar cell apparatus of claim 1, wherein the inert gas includes at least one of nitrogen gas ($N_2$) and argon gas (Ar).

* * * * *